(12) United States Patent
Yun

(10) Patent No.: US 7,671,969 B2
(45) Date of Patent: Mar. 2, 2010

(54) SEMICONDUCTOR WAFER FLATNESS CORRECTION APPARATUS AND METHOD

(75) Inventor: Jang-Hyun Yun, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 363 days.

(21) Appl. No.: 11/707,046

(22) Filed: Feb. 16, 2007

(65) Prior Publication Data

US 2007/0195306 A1    Aug. 23, 2007

(30) Foreign Application Priority Data

Feb. 20, 2006    (KR) .................. 10-2006-0016465

(51) Int. Cl.
G03B 27/58    (2006.01)
G03B 27/60    (2006.01)
G03B 27/62    (2006.01)

(52) U.S. Cl. ................. 355/72; 355/73; 355/75

(58) Field of Classification Search ............ 355/72, 355/76, 53, 55; 356/399, 400, 401; 250/548
See application file for complete search history.

(56) References Cited

U.S. PATENT DOCUMENTS 6,137,562 A * 10/2000 Masuyuki et al. ............. 355/73
6,888,621 B2 * 5/2005 Araki et al. .................... 355/75

FOREIGN PATENT DOCUMENTS

| JP | 08-279549 | | 10/1996 |
| JP | 2002039745 A | * | 2/2002 |
| KR | 20-0185288 | | 3/2000 |
| KR | 1020010026929 A | | 4/2001 |
| KR | 1020030028985 A | | 4/2003 |

* cited by examiner

Primary Examiner—Peter B Kim
(74) Attorney, Agent, or Firm—Volentine & Whitt, PLLC

(57) ABSTRACT

There are provided a wafer stage, an exposure apparatus having the same, and a wafer flatness correction method using the same. The wafer stage includes a chuck having first and second vacuum holes, a first vacuum pump applying a vacuum suction force to the first vacuum holes and a second vacuum pump applying a vacuum suction force to the second vacuum holes. Further, the exposure apparatus and the wafer flatness correction method using the same are disclosed.

13 Claims, 8 Drawing Sheets

SEMICONDUCTOR WAFER FLATNESS CORRECTION APPARATUS AND METHOD

BACKGROUND OF INVENTION

1. Field of the Invention

The present invention relates to a semiconductor manufacturing apparatus, and more particularly, to a wafer stage capable of correcting the flatness of a wafer placed on a chuck using a vacuum suction force and a method employing same.

This application claims priority from Korean Patent Application No. 10-2006-0016465, filed Feb. 20, 2006, the disclosure of which is hereby incorporated herein by reference in its entirety as if set forth fully herein.

2. Discussion of the Related Art

In general, semiconductor devices are manufactured by repeatedly performing processes such as etching, diffusion, deposition, and photolithography in a selective or sequential manner. The photolithography process mainly includes an application process for applying a photoresist onto a wafer, an exposure process for disposing a reticle in which a circuit pattern is designed on the wafer on which the photoresist is applied and for radiating light onto the wafer. A development process selectively removes the photoresist using a developer by dividing a portion exposed to the light radiated during the exposure process and an unexposed portion.

Here, the apparatus for performing the photolithography process is mainly classified into an application and development apparatus generally called a spinner, and an exposure apparatus generally called a scanner or stepper. The application and development apparatus and the exposure apparatus are in-line linked to perform the photolithography process on the wafer. The exposure apparatus includes a wafer stage on which a wafer is placed. Here, the wafer stage includes a chuck on which the wafer is placed directly by a vacuum suction force applied through a central portion of the chuck. A plurality of protrusions supporting the bottom surface of the wafer is provided on the top surface of the chuck.

Typically, a wafer is placed on the upper side of the chuck while the central portion of the wafer is supported by a lift pin. The bottom surface of the wafer is supported by the protrusions of the chuck while a predetermined vacuum suction force is applied to the bottom surface of the wafer through holes in the central portion of the chuck. The vacuum suction force is applied between the protrusions on the upper side of the chuck. Because the vacuum suction is applied to the central portion of the wafer, this suction force decreases toward the edge of the wafer which allows the edge of the wafer to deflect upward. The inclination of the edge of the wafer increases the step rate at the edge of the wafer. Thus, the focus length becomes short causing a focusing defect and a normal circuit pattern cannot be transferred onto the edge of the wafer increases product defect rates. In addition, the wafer is more stepped toward the edge after the polishing process. When the exposure is performed onto the top surface of the wafer's edge stepped in this manner, a focusing defect may be caused as described above.

SUMMARY OF THE INVENTION

The present invention is directed to providing a wafer flatness correction apparatus and method comprising a wafer stage capable of preventing focus defects in an exposure region of a wafer. The present invention provides a wafer stage including a chuck having first and second vacuum holes, a first vacuum pump applying a vacuum suction force to the first vacuum holes and a second vacuum pump applying a vacuum suction force to the second vacuum holes. The second vacuum pump may be electrically connected to a wafer flatness correction assembly having a distance measuring unit which measures the distance to a top surface of a wafer placed on a chuck. A controller is used to compare the measured distance to a preset reference distance value, and based on the result of this comparison, controls the operation of the second vacuum pump so that the value of the measured distance and the reference value distance become equal. The controller may also control the operation of both the first and second vacuum pumps to provide suction to the wafer so that the value of the measured distance and the reference value distance become equal. This ensures that the wafer edge is sufficiently flat to prevent focus defects and improve production yields.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DESCRIPTION OF EMBODIMENTS

Figure 1:
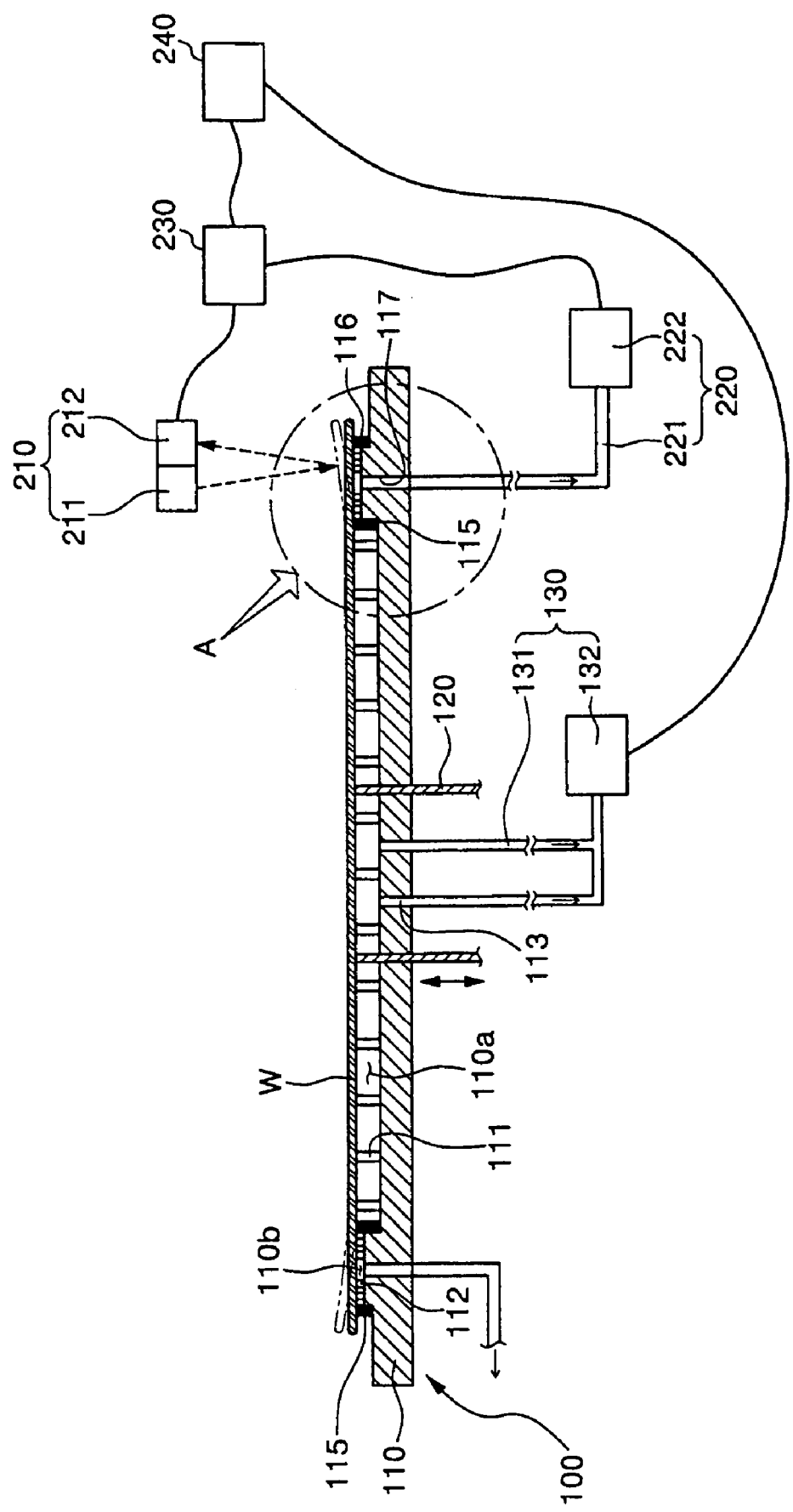
FIG. 1 is a plain view illustrating a chuck of a wafer stage of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Referring to FIG. 1, a wafer stage in accordance with the present invention includes a chuck 100 through which a plurality of first vacuum holes 113 and a plurality of second vacuum holes 117 are formed. A lift pin 120 raises and lowers wafer W through a central portion of chuck 100. A first vacuum supply unit includes a first vacuum pump 132 and a first vacuum tube 131. The first vacuum pump 132 is connected to first vacuum holes 113 through tube 131 to provide a first vacuum suction force to first vacuum holes 113. A second vacuum supplying unit includes a second vacuum pump 222 and a second vacuum tube 221. The second vacuum pump 222 is connected to second vacuum holes 117 through second tube 221 which provides a second vacuum suction force to second vacuum holes 117. The second vacuum pump 222 is electrically connected to a wafer flatness correction unit which is comprised of a distance measuring unit 210 positioned above chuck 100 and a controller 230 electrically connected to distance measuring unit 210 and second vacuum pump 222.

The distance measuring unit 210 includes a light-emitter 211 radiating light onto a top surface of wafer W and a light-receiver 212 receiving light reflected from the top surface of wafer W. Distance measuring unit 210 calculates a distance "L" measured from unit 210 to the top surface of wafer W from which the light is reflected by using the time taken until the light is received by receiver 212 after being radiated from emitter 211 and reflected from wafer W where the speed of the radiated light is preferably constant. A reference distance value "K" measured from unit 210 to a flat wafer positioned on chuck 100 is preset in controller 230. The distance measured by the distance measuring unit 210 is electrically transmitted to controller 230 and is compared with the reference distance "K". Based on this comparison, controller 210 controls the operation of second vacuum pump 222 to provide suction to second vacuum holes 117 to retain the flatness of wafer W which is determined when measured distance L equals preset reference value K. Controller 230 may also be electrically connected to first vacuum pump 132 to control the operation of first vacuum pump 132 and second vacuum pump 222 so that measured value L equals reference value K.

A body 110 includes a first vacuum region 110a and a second vacuum region 110b. First vacuum region 110a includes a plurality of first placing protrusions 111 and first vacuum holes 113. Second vacuum region 110b is located around first vacuum region 110a and includes a plurality of second placing protrusions 112 and second vacuum holes 117. A first seal ring is disposed at the boundary between the first and second vacuum regions 110a and 110b. The top surfaces of the first and second placing protrusions 111 and 112 and the top of first seal ring 115 are flush with the same horizontal plane. A second seal ring 116 having a top surface flush with that of the first seal ring 115 may also be provided around second vacuum region 110b.

Figure 4:
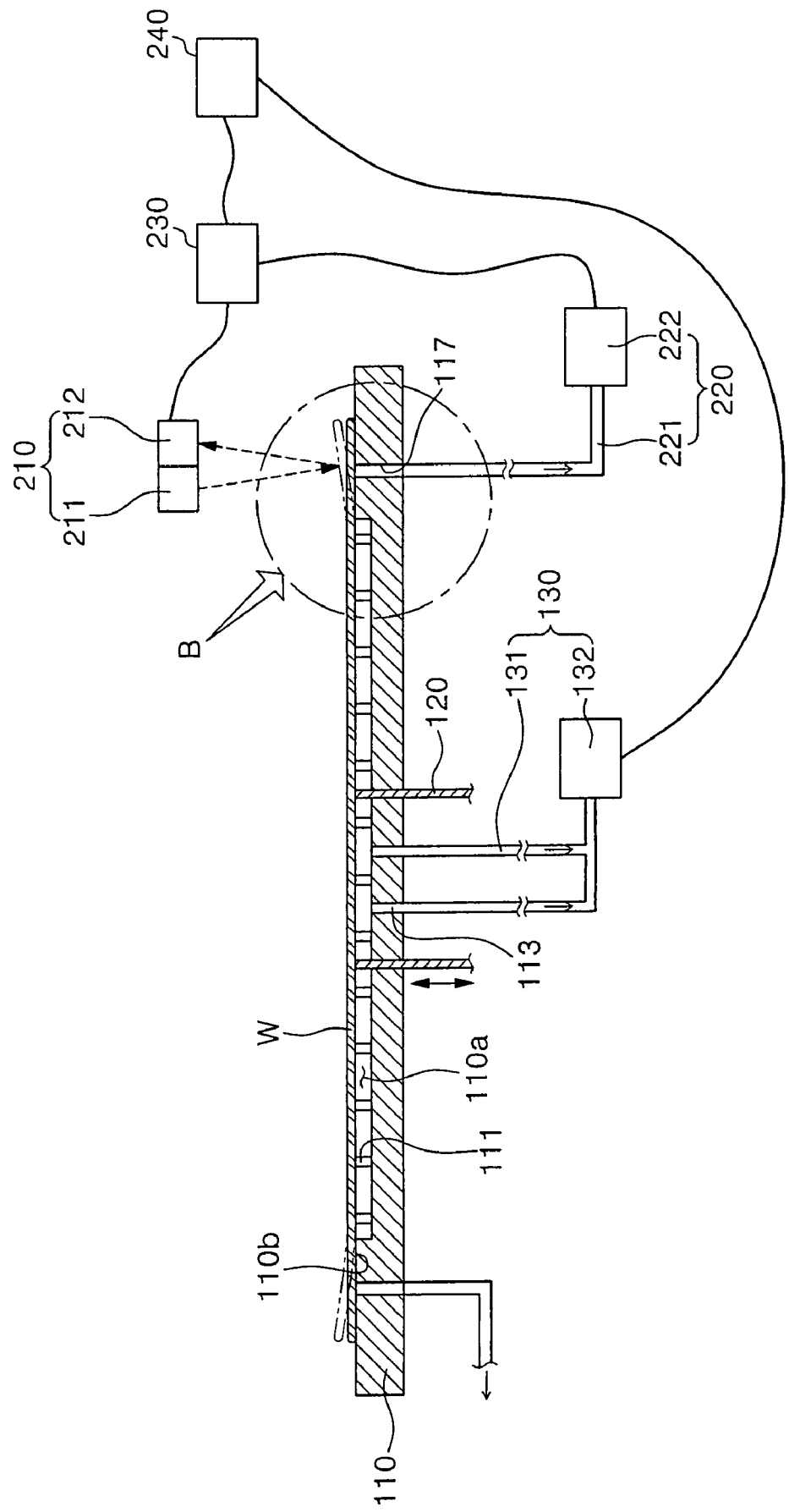
FIG. 4 is a sectional view illustrating another embodiment of the wafer stage of the present invention.
Figure 5:
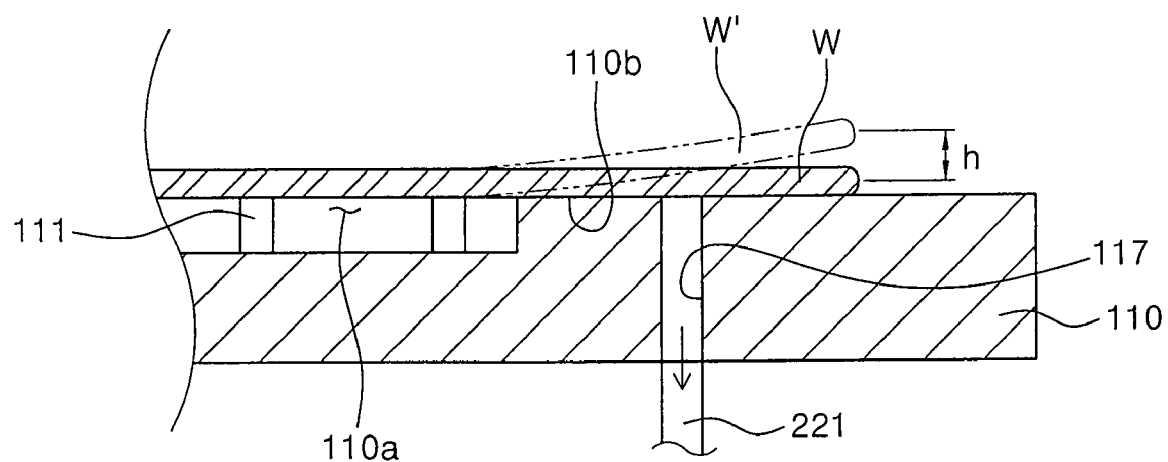
FIG. 5 is a partially enlarged view of a portion indicated by a mark B shown in FIG. 3.

FIGS. 4 and 5 illustrate an alternative embodiment of chuck 100 which includes a first vacuum region 110a and second vacuum region 110b. First vacuum region 110a has a plurality of first placing protrusions 111 and first vacuum holes 113. Second vacuum region 110b is located around first vacuum region 110a and includes second vacuum holes 117. Second vacuum region 110b is formed so that it is in a stepped relationship with first vacuum region 110a. In particular, the exposed top surface of the second vacuum region 110b is formed at a level higher than that of the first vacuum region 110a such that top surfaces of first placing protrusions 111 and second vacuum region 110b are flush with the same horizontal plane. The first vacuum region 110a is located on the chuck so that it opposes the bottom central portion of the wafer W and the second vacuum region 110b is located so that it opposes a bottom side edge of wafer W. Further, the exposed surface of the second vacuum region 110b and the bottom surface of the edge of wafer W are adapted to closely contact each other.

In operation, wafer W is raised to the upper side of chuck 100 by a wafer conveyor (not shown) and is disposed on lift pin 120 which descends to dispose wafer W on chuck 100. First vacuum pump 132 provides a predetermined amount of suction force to first vacuum region 110a via first vacuum holes 113 which acts on bottom central portion of wafer W. Bottom surface of wafer W is placed on and contacts top surface of the first and second placing protrusions 111 and 112, respectively. First and second vacuum regions 110a and 110b are isolated from each other by first seal ring 115 disposed at the boundary therebetween which prevents first vacuum suction force from leaking to second vacuum region 110b. Since the degree of suction at region 110b in which the edge of wafer W is located is smaller than the degree of suction at first vacuum region 110a. This may cause the edge of the wafer W to deflect upwardly by a predetermined height "h".

The distance measuring assembly 210 positioned above chuck 100 measures the distance to the top surface of the edge of wafer W. Specifically, light-emitting unit 211 radiates light onto the top surface of wafer W. The radiated light is reflected off of wafer W and received by light-receiving unit 212. Distance measuring assembly 210 calculates the distance to the top surface of wafer W based on the elapsed time for light with a predetermined speed to be received by unit 212 after being radiated by unit 211 and reflected off of wafer W.

The distance measuring assembly 210 transmits this measured distance value to controller 230 and compares it to a reference distance value preset in controller 230. The reference distance value is preferably set so that focus defects are avoided when the upper surface of the edge of wafer W is exposed.

Controller 230 compares the measured distance value with the reference value. If these values are not equal to each other, where the edge of wafer W is deflected upward by distance h, the measured distance L is less than the preset distance K, controller 230 controls the operation of second vacuum pump 222. The suction applied to pump 222 provides suction to region 110b via vacuum holes 117 so that the measured value L equals the reference distance K, thereby correcting the flatness of wafer W.

First and second vacuum suction regions 110a and 110b are isolated from each other by first seal ring 115 and second vacuum region 110b is isolated from the outside by second seal ring 116 which comes into close contact with the bottom surface of the edge of wafer W. In this manner, the vacuum suction force generated in first and second vacuum regions 110a and 110b, respectively, does not leak outside of the respective regions. The first and second vacuum forces provided as described above can be visually displayed on display 240 electrically connected to controller 230. Therefore, an operator can monitor the variable vacuum suction forces generated in the first and second vacuum regions 110a and 110b.

The above description has been made where the edge of wafer W is deflected upward since the degree of vacuum suction to second region 110b is smaller than that of first vacuum region 110a. However, where the edge of wafer W is deflected downward where the measured distance value is larger than the preset distance value. In this case, controller 230 transmits an operation signal to first vacuum pump 132 without operating second vacuum pump 222 until the measured distance is equal to the reference distance value. Then, the first vacuum pump 132 gradually increases the first vacuum suction force via first vacuum holes 113. When the measured distance value equals the reference distance value, controller 230 stops the operation of first vacuum pump 132. The first suction force applied to first vacuum region 110a is greater than the initial vacuum suction force provided to region 110a when wafer W was originally positioned on chuck 110. Thus, when the edge of wafer W is deflected downward, the application of additional suction force to region 110a corrects the flatness of the edge of wafer W. Controller 230 can visually display the variable first vacuum suction force generated in first vacuum suction region 110a on display 240.

Since the first and second vacuum regions 110a and 110b are isolated from each other by the first seal ring 115, first vacuum suction force generated in first vacuum region 110a does not leak to second vacuum region 110b. Therefore, the top surface of the wafer W can be made flat. Since an exposure process is performed after the wafer W is corrected flatly, it is possible to prevent exposure pattern defects caused by focus defects.

Figure 6:
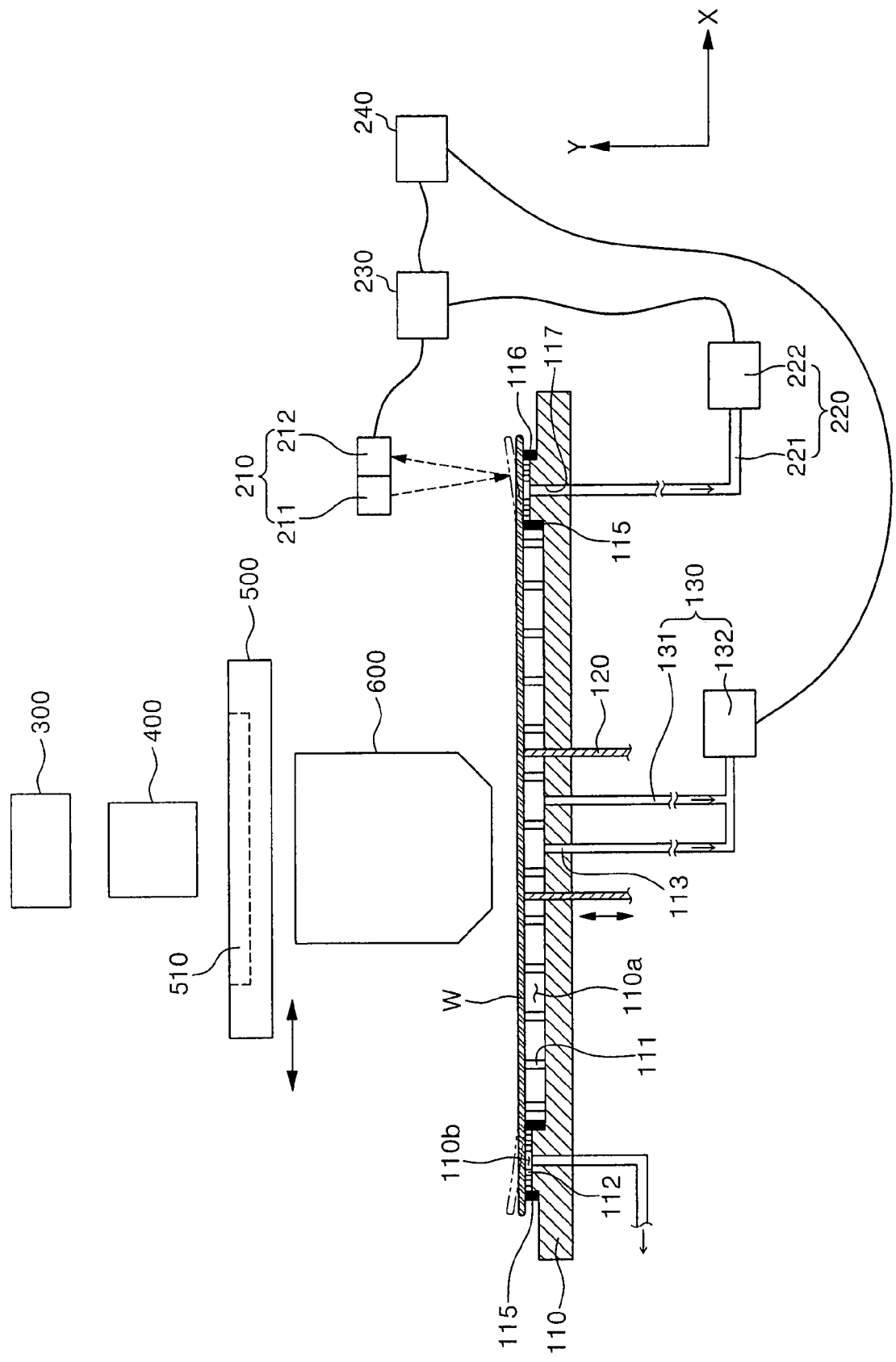
FIG. 6 is a sectional view schematically illustrating an exposure apparatus of the present invention.

FIG. 6 schematically illustrates an exposure apparatus including light source 300, a reticle stage 500 disposed below the light source 300, a lens system 400 disposed between the light source 300 and reticle stage 500, a reductive projection optical system 600 disposed below reticle stage 500, and a wafer stage disposed below the reductive projection optical system 600. Reticle stage 500 is movable on a plane and includes a reticle 510 in which a predetermined circuit pattern is formed. Further, the wafer stage is also movable on a plane and has the same structure as that of the wafer stage described with reference to FIGS. 1-3 and FIGS. 4 and 5.

Figure 7:
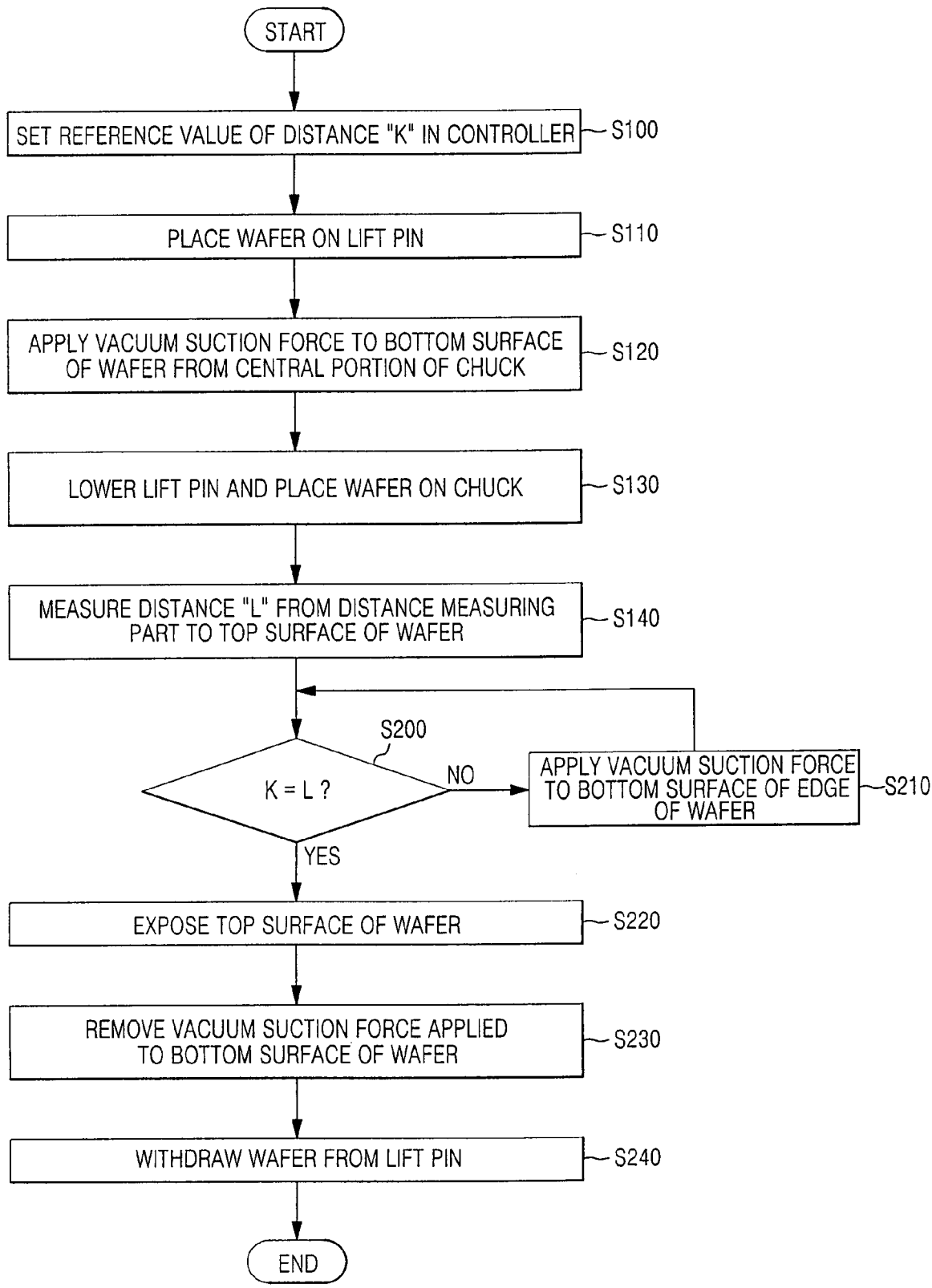
FIG. 7 is a view illustrating an embodiment of a wafer flatness correction method using the wafer stage of the present invention.

The operation and effect of the exposure apparatus constructed as described above will now be described. In order to planarize a wafer W to be exposed, flatness correction is performed with respect to wafer W placed on the upper side of chuck 100 as shown in FIGS. 1 and 4. As described above, the flatness correction of wafer W is performed by providing second vacuum suction force to second vacuum suction region 110b corresponding to the bottom surface of the edge of wafer W or by controlling the first suction force in first vacuum suction region 110a corresponding to the central bottom surface of wafer W. In this manner, when the measured value of the distance from distance measuring part 210 to the top surface of wafer W becomes equal to the reference distance value, the flatness correction of wafer W to be exposed is completed thereby preventing focus defects. Controller 230 transmits an electrical signal to light source 300 to radiate light which passes through lens system 400 onto the upper side of reticle 510. The light passes through the reticle 510 in which a predetermined circuit pattern is formed and is radiated onto the projective optical system 600, whereby the circuit pattern can be reductively projected onto the top surface of wafer W. Since the flatness correction process of the wafer W is performed before the exposure as described above, an image of the circuit pattern which is reductively projected in this way can be precisely transferred onto the top surface of the wafer W. Thus, it is possible to prevent conventional exposure pattern defects generated when the edge of wafer W is deflected upwardly or downwardly which causes focus defects. A precise exposure pattern can be formed even on the top surface region of the edge of wafer W so that the number of semiconductor devices capable of being produced per unit wafer W increases, thereby increasing product yields. Next, the wafer flatness correction method to solve the above-described problem will be described with reference to FIGS. 7 and 8. Further, the structure of the wafer stage used in this method can be referred to in FIG. 1 or 2. FIG. 7 is a flow chart showing an embodiment of the wafer flatness correction method in accordance with the present invention. First, a reference value of a distance "K" is set in controller 230 at step S100 which is the reference distance from measuring unit 210 to the top surface of wafer W. This reference value K is set to avoid focus defects when the upper surface of wafer W is exposed to light. In step S110, wafer W is placed on lift pin 120. A vacuum suction force is applied to the central bottom portion of wafer W from the central portion of chuck 100 at step S120. Here, a predetermined vacuum suction force is applied to the first vacuum region 110a by first vacuum pump 132 shown in FIGS. 1 and 4. As the first vacuum suction force is applied, lift pin 120 descends and wafer W is placed on chuck 100 as step S130.

Figure 2:
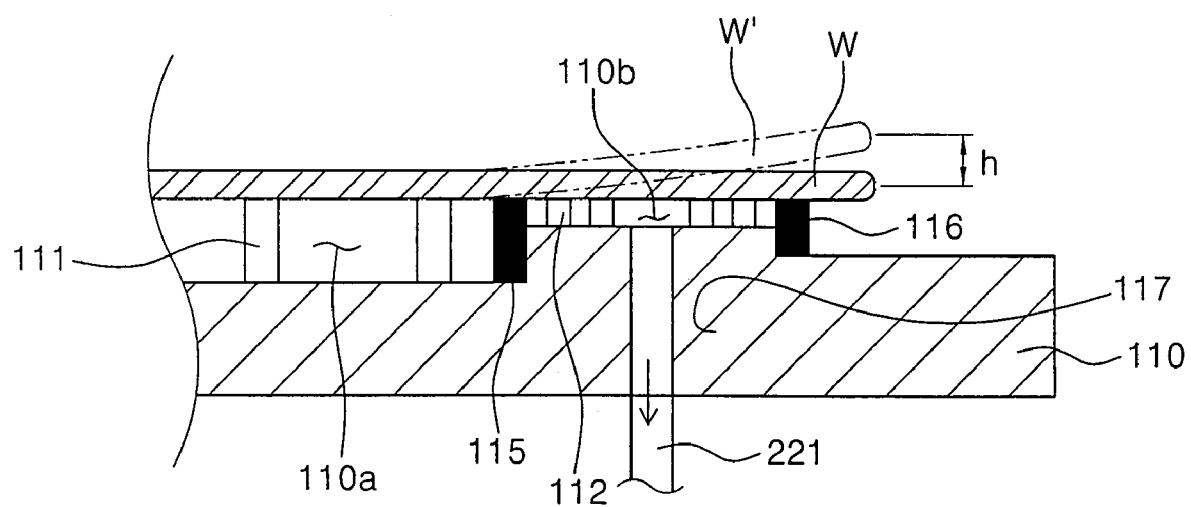
FIG. 2 is a section view illustrating an embodiment of the wafer stage of the present invention.
Figure 3:
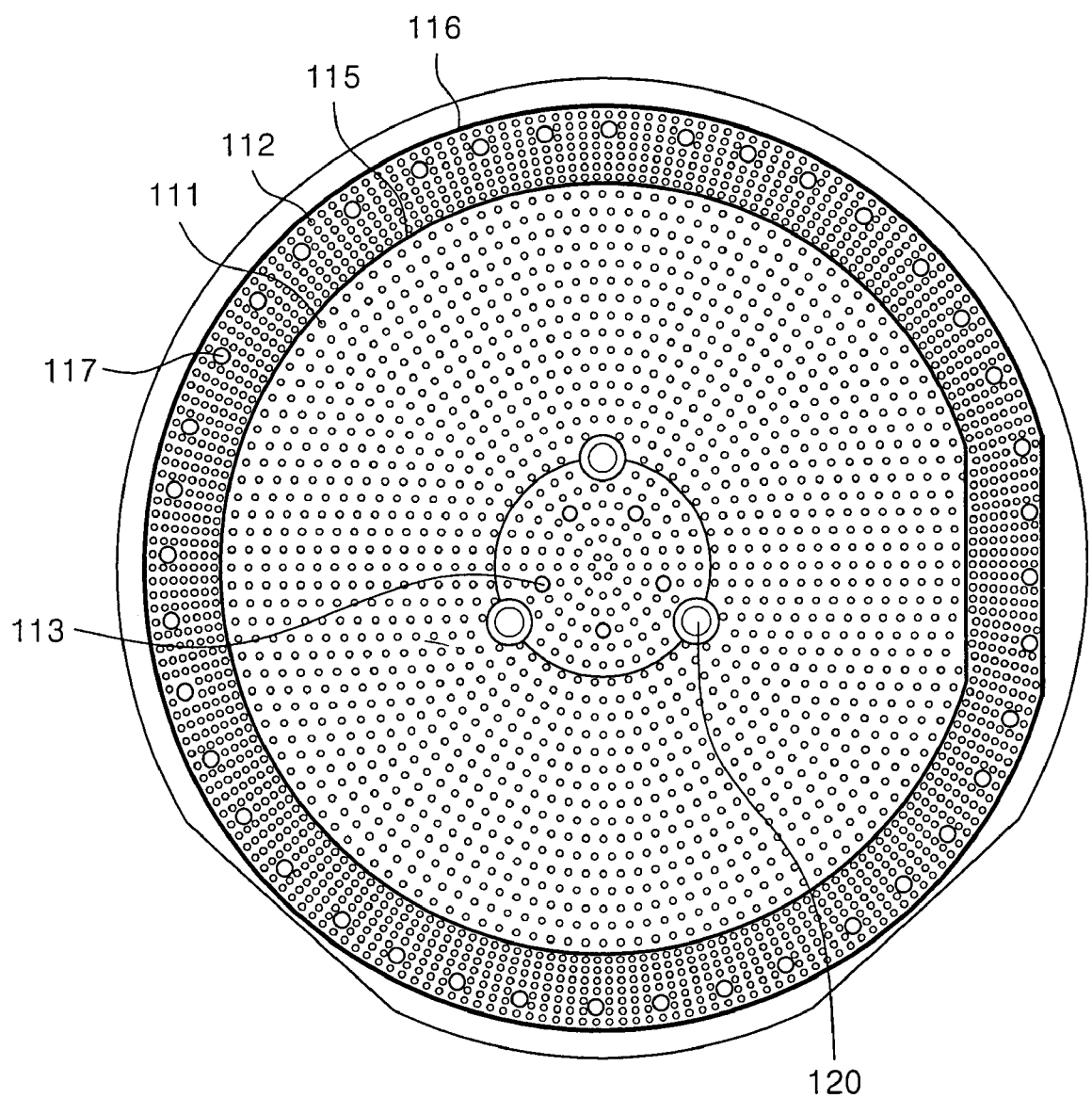
FIG. 3 is a partially enlarged view of a portion indicated by a mark A shown in FIG. 1.

As shown in FIG. 1, the outer edge portion of wafer W located in the second vacuum region 110b may be deflected upwardly a distance "h" as shown in FIG. 2 due to the first vacuum suction force applied by first vacuum pump 132 to the central portion of wafer W at first vacuum region 110a. In other words, a suction force applied to the central portion of wafer W may cause the outer edge portion to lift up a distance h. The distance measuring unit 210 measures the value of the distance "L" to the top surface of wafer W at step S140 and transmits this value to controller 230. In step S200, controller 230 determines whether the preset distance value "K" equals measured distance value "L". If "K" and "L" are not equal, controller 230 operates second vacuum pump 222 until "K" becomes equal to "L" and gradually applies a second vacuum suction force to second vacuum region 110b at step S210. Once the measured distance value L becomes equal to the preset distance K, the top surface of wafer W is flat. If "K" and "L" become equal to each other, it is considered that the top surface becomes flat. At this time, the exposure for transferring a predetermined circuit pattern onto the top surface of wafer W is performed using the exposure apparatus shown in FIG. 6 at step S220. Since the circuit pattern is exposed without a focus defect, the image of a circuit pattern to be formed on the top surface of the wafer W can be precisely formed without any focus defect. Further, since the top surface of the edge of wafer W in which the probability of occurrence of deflection is high also becomes flat, a circuit pattern with no focus defects can be also transferred onto the top surface of the wafer W.

When the exposure of the wafer is completed, the first and second suction forces generated in first and second vacuum regions 110a and 110b is removed from wafer W at step S230. Lift pin 120 ascends to a standby position in a state which supports wafer W. Then, wafer W is withdrawn by wafer conveyor at step S240.

Figure 8:
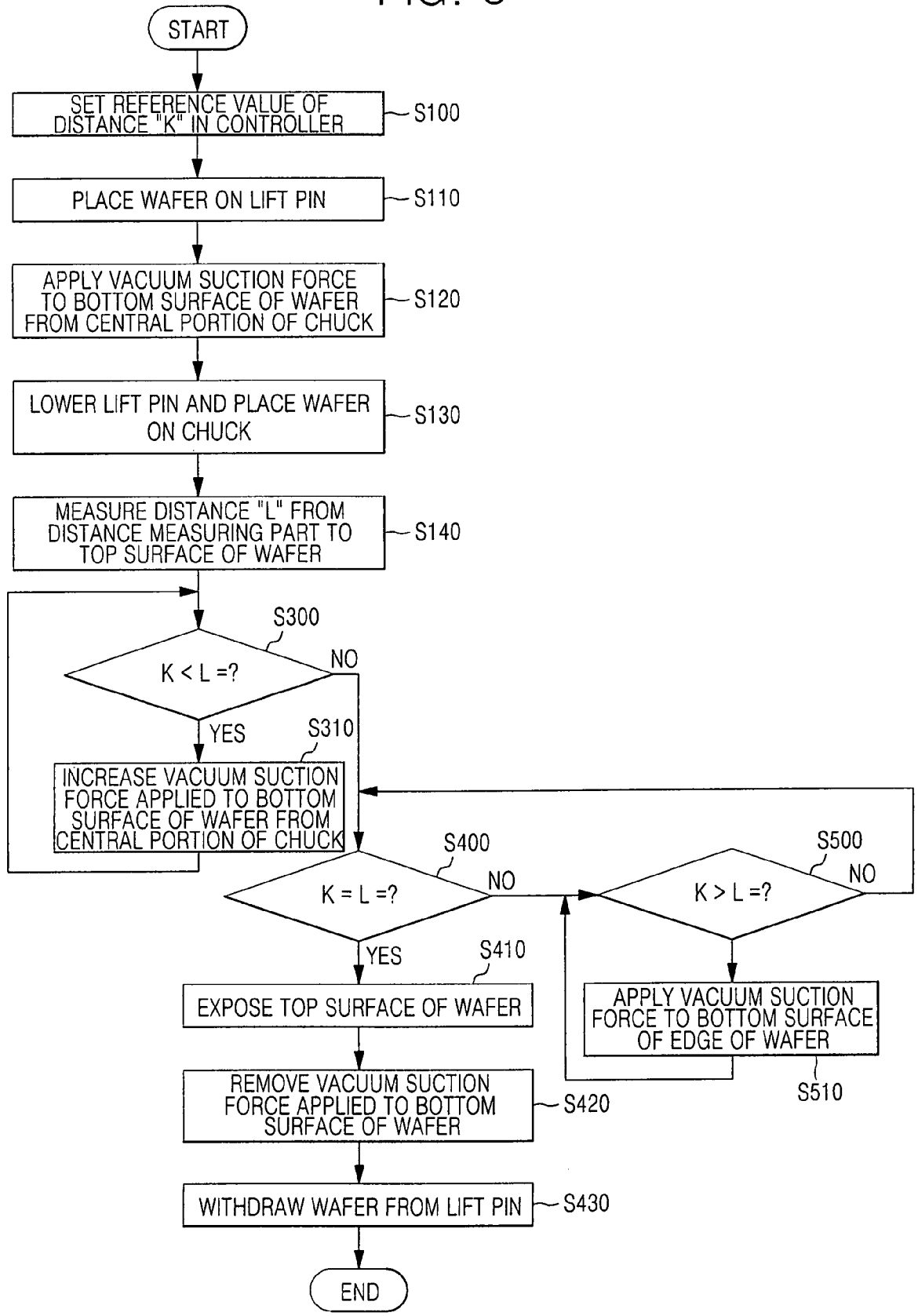
FIG. 8 is a view illustrating another embodiment of the wafer flatness correction method using the wafer stage of the present invention.

FIG. 8 is a flowchart illustrating another embodiment of the wafer flatness correction method of the present invention. The steps from S100-S140 are the same as those described above. Controller 230 determines whether or not "L" is larger than "K" at step S300. When "L" is larger than "K", the edge of wafer W is deflected downward. To correct for this downward movement, first vacuum suction force is increased to the central bottom portion of wafer W.

Therefore, the first vacuum suction force applied to the central b at first vacuum region 110a at step S310. When "L" is less than "K", step S400 determines whether or not "L" is equal to "K". If "L" is equal to "K", the flatness correction of the top surface of wafer W is completed and wafer exposure is performed at step S410. After exposure is completed, wafer W is withdrawn from lift pin 120 at step S430 by removing the vacuum suction force applied to the bottom surface of the wafer at step S420.

If "L" is not equal to "K", controller 230 determines whether or not "L" is smaller than "K" at step S500. When "L" is smaller than "K" which corresponds to the case in which the edge of wafer W is deflected upwardly, the second vacuum suction force is gradually applied to second vacuum suction region 110b on the bottom surface of wafer W at step S510. At step S400 controller 230 determines whether or not "L" is equal to "K". When "L" is equal to "K", the flatness correction of the top surface of wafer W as described above is completed and the wafer is ready for exposure. Once the exposure step is completed, wafer W is withdrawn from lift pin 120 at step S430 by removing the vacuum suction force applied to the bottom surface of wafer W at S420.

In this manner, a circuit pattern is formed on a wafer W with a precise focus length in the top surface region of the edge of the wafer whose step rate is large, whereby it is possible to solve the conventional exposure pattern defect problem caused by the focus length defect at the edge of the wafer. Therefore, it is possible to increase the product yield ratio and to decrease the product defect ratio by using the apparatus and methods described herein.

What is claimed is:

1. A wafer stage apparatus comprising:
   a chuck having first and second vacuum holes and configured to receive a wafer, wherein the first vacuum holes are disposed under a central portion of the wafer and the second vacuum holes are disposed under a peripheral edge portion of the wafer;
   a first vacuum pump configured to apply a vacuum suction force via the first vacuum holes to the central portion of the wafer;
   a second vacuum pump configured to apply a vacuum suction force via the second vacuum holes to the peripheral edge portion of the wafer;
   a controller electrically connected to the second vacuum pump and configured to store a preset reference distance value "K"; and
   a wafer flatness unit electrically connected to the controller and comprising a distance measuring unit configured to measure a distance "L" between the distance measuring unit and a top surface of the wafer and provide the distance "L" to the controller,
   wherein the controller is further configured to compare the distance "L" with the preset reference distance "K", and control operation of the second vacuum pump to apply the vacuum suction force via the second vacuum holes to the edge portion of the wafer such that the distance "L" becomes equal to the preset reference distance "K".

2. The wafer stage apparatus according to claim 1, wherein said wafer flatness correction unit is also electrically connected to the first vacuum pump, and the controller is further configured to control operation of the first vacuum pump to the apply suction force via the first vacuum holes to the central portion of the wafer such that the distance "L" becomes equal to the preset reference distance "K".

3. The wafer stage apparatus according to claim 1, wherein the chuck comprises:
   a body through which the first and second vacuum holes are formed;
   a first vacuum region of the body, centrally disposed under the wafer and comprising the first vacuum holes and a plurality of first placing protrusions;
   a second vacuum region of the body, peripherally disposed under the wafer and surrounding the first vacuum region and comprising the second vacuum holes.

4. The wafer stage apparatus according to claim 3, wherein the chuck further comprises:
   a first seal ring disposed between the first and second vacuum regions.

5. The wafer stage apparatus according to claim 4, further comprising a second seal ring disposed around the second vacuum region.

6. The wafer stage apparatus according to claim 5, wherein respective top portions of the first and second seal rings are flush with a common horizontal plane.

7. A semiconductor exposure apparatus comprising:
   a light source;
   a reticle stage disposed below the light source and on which a reticle having a predetermined circuit pattern formed thereon is placed;
   a projection optical system disposed below the reticle stage;
   a chuck, disposed below the projection optical system and adapted to receive a wafer, wherein the chuck comprises first vacuum holes disposed under a central portion of the wafer and second vacuum holes disposed under a peripheral edge portion of the wafer;
   a first vacuum pump configured to apply a suction force to the central portion of the wafer via the first vacuum holes;
   a second vacuum pump configured to apply a suction force to the peripheral edge portion of the wafer via the second vacuum holes,
   a controller electrically connected to the second vacuum pump and configured to store a preset reference distance value "K"; and
   a wafer flatness unit electrically connected to the controller and comprising a distance measuring unit configured to measure a distance "L" between the distance measuring unit and a top surface of the wafer and provide the distance "L" to the controller,
   wherein the controller is further configured to compare the distance "L" with the preset reference distance "K", and control operation of the second vacuum pump to apply the vacuum suction force via the second vacuum holes to the edge portion of the wafer such that the distance "L" becomes equal to the preset reference distance "K".

8. The exposure apparatus according to claim 7, wherein the wafer flatness correction unit is also electrically connected to the first vacuum pump, and the controller is further configured to control operation of the first vacuum pump to the apply suction force via the first vacuum holes to the central portion of the wafer such that the distance "L" becomes equal to the preset reference distance "K".

9. The exposure apparatus according to claim 7, wherein the chuck comprises:
   a body through which the first and second vacuum holes are formed;
   a first vacuum region of the body, centrally disposed under the wafer and comprising the first vacuum holes and a plurality of first placing protrusions;
   a second vacuum region of the body, peripherally posed under the wafer and surrounding the first vacuum region and comprising the second vacuum holes.

10. The exposure apparatus according to claim 9, wherein the chuck further comprises:
    a first seal ring disposed between the first and second vacuum regions.

11. The exposure apparatus according to claim 10, further comprising a second seal ring disposed around the second vacuum region.

12. The exposure apparatus according to claim 11, wherein respective top portions of the first and second seal rings are flush with a common horizontal plane.

13. A semiconductor wafer flatness correction method comprising:
    placing a wafer on a chuck by applying a first vacuum suction force to the wafer via first vacuum holes disposed under a central portion of the wafer;
    measuring a distance "L" between a distance measuring unit disposed above the wafer and a top surface of the wafer;
    comparing the measured distance "L" with a preset reference distance "K"; and on the basis of the comparison between the measured distance "L" and the preset reference distance "K", applying a second vacuum suction force to the wafer via second vacuum holes disposed under a peripheral edge portion of the wafer surrounding the central portion of the wafer to flatten the wafer such that the distance "L" becomes equal to the preset reference distance "K".

* * * * *